(12) United States Patent
Chen et al.

(10) Patent No.: US 12,189,204 B2
(45) Date of Patent: Jan. 7, 2025

(54) OPTICAL SYSTEM

(71) Applicant: TDK TAIWAN CORP., Taoyuan (TW)

(72) Inventors: Yi-Ho Chen, Taoyuan (TW); Ying-Jen Wang, Taoyuan (TW); Ya-Hsiu Wu, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 0 days.

(21) Appl. No.: 18/476,930

(22) Filed: Sep. 28, 2023

(65) Prior Publication Data
US 2024/0027724 A1 Jan. 25, 2024

Related U.S. Application Data

(63) Continuation of application No. 17/459,819, filed on Aug. 27, 2021, now Pat. No. 11,809,015.
(Continued)

(51) Int. Cl.
*G02B 7/04* (2021.01)
*G01L 1/16* (2006.01)
(Continued)

(52) U.S. Cl.
CPC .................. *G02B 7/04* (2013.01); *G01L 1/16* (2013.01); *G02B 7/003* (2013.01); *G02B 7/02* (2013.01); *G02B 7/09* (2013.01); *G02B 7/1821* (2013.01); *G02B 13/001* (2013.01); *G02B 26/0816* (2013.01); *G02B 26/0875* (2013.01); *G02B 27/0006* (2013.01); *G02B 27/646* (2013.01); *G03B 5/00* (2013.01); *G03B 5/02* (2013.01); *G03B 17/12* (2013.01); *G06F 3/016* (2013.01); *H02K 41/0354* (2013.01); *H03K 17/964* (2013.01); *H04N 23/54* (2023.01); *H04N 23/55* (2023.01); *H04N 23/685* (2023.01); *H10N 30/302* (2023.02); *G03B 2205/0069* (2013.01); *H02K 41/0356* (2013.01); *H03K 2217/96062* (2013.01)

(58) Field of Classification Search
CPC . G02B 7/04; G02B 7/003; G02B 7/02; G02B 7/09; G02B 7/1821; G02B 13/001; G02B 26/0816; G02B 26/0875; G02B 27/0006; G02B 27/646; G01L 1/16; G03B 5/00; G03B 5/02; G03B 17/12; G06F 3/016
USPC ........................................................ 359/824
See application file for complete search history.

(56) References Cited

U.S. PATENT DOCUMENTS 10,382,687 B1 8/2019 Patel et al.
2009/0085558 A1 4/2009 David et al.
(Continued)

*Primary Examiner* — William R Alexander
(74) *Attorney, Agent, or Firm* — MUNCY, GEISSLER, OLDS & LOWE, P.C.

(57) ABSTRACT

An optical system is provided, including a movable part, a fixed part, a first sensor, a second sensor, and a control unit, wherein an optical element is disposed on the movable part. The first and second sensors detect the movement of the movable part relative to the fixed part in a first dimension and a second dimension, and thus they respectively generate a first sensing value and a second sensing value. The control unit generates an error value according to the first sensing value and an error curve, and then calibrates the second sensing value according to the error value.

20 Claims, 14 Drawing Sheets

Related U.S. Application Data

(60) Provisional application No. 63/071,550, filed on Aug. 28, 2020.

(51) Int. Cl.
| | |
|---|---|
| *G02B 7/00* | (2021.01) |
| *G02B 7/02* | (2021.01) |
| *G02B 7/09* | (2021.01) |
| *G02B 7/182* | (2021.01) |
| *G02B 13/00* | (2006.01) |
| *G02B 26/08* | (2006.01) |
| *G02B 27/00* | (2006.01) |
| *G02B 27/64* | (2006.01) |
| *G03B 5/00* | (2021.01) |
| *G03B 5/02* | (2021.01) |
| *G03B 17/12* | (2021.01) |
| *G06F 3/01* | (2006.01) |
| *H02K 41/035* | (2006.01) |
| *H03K 17/96* | (2006.01) |
| *H04N 23/54* | (2023.01) |
| *H04N 23/55* | (2023.01) |
| *H04N 23/68* | (2023.01) |
| *H10N 30/30* | (2023.01) |

(56) References Cited

U.S. PATENT DOCUMENTS

| | | | |
|---|---|---|---|
| 2012/0008929 | A1 | 1/2012 | David et al. |
| 2012/0014682 | A1 | 1/2012 | David et al. |
| 2014/0104486 | A1 | 4/2014 | Seol et al. |
| 2015/0350549 | A1 | 12/2015 | Gregory et al. |
| 2016/0070270 | A1 | 3/2016 | Beard et al. |
| 2016/0212344 | A1 | 7/2016 | Takeuchi |
| 2016/0327806 | A1 | 11/2016 | Kasamatsu |
| 2017/0299843 | A1* | 10/2017 | Lee .......................... G03B 3/10 |
| 2017/0331993 | A1* | 11/2017 | Xu .......................... G02B 7/026 |
| 2017/0347033 | A1* | 11/2017 | Miller ................ H04N 23/6812 |
| 2018/0249082 | A1 | 8/2018 | Saito et al. |
| 2018/0329170 | A1* | 11/2018 | Huang ................... H01F 7/066 |
| 2019/0004279 | A1 | 1/2019 | Park et al. |
| 2019/0058423 | A1 | 2/2019 | Knoedgen et al. |
| 2020/0137308 | A1 | 4/2020 | Kulik et al. |
| 2020/0149877 | A1 | 5/2020 | Lee |
| 2020/0209710 | A1 | 7/2020 | Park et al. |
| 2020/0333556 | A1* | 10/2020 | Huang ................... G01D 5/145 |
| 2020/0341234 | A1* | 10/2020 | Park ......................... G02B 7/02 |

\* cited by examiner

OPTICAL SYSTEM

CROSS REFERENCE TO RELATED APPLICATIONS

This application is a continuation application of U.S. patent application Ser. No. 17/459,819, filed Aug. 27, 2021, which claims priority of provisional U.S. Patent Application Ser. No. 63/071,550, filed on Aug. 28, 2020, the entirety of which is incorporated by reference herein.

BACKGROUND OF THE INVENTION

Field of the Invention

The application relates in general to an optical system, and in particular, to an optical system that has a movable part and a fixed part.

Description of the Related Art

As technology has advanced, a lot of electronic devices (for example, laptop computers and smartphones) have incorporated the functionality of taking photographs and recording video. These electronic devices have become more commonplace, and have been developed to be more convenient and thin. More and more options are provided for users to choose from.

In some electronic devices, several coils and magnets are usually used for adjusting the focus of a lens. Additionally, several magnetic elements and sensors are respectively disposed on the movable part and the fixed part of an optical system in the electronic device. The sensors can detect the magnetic fields of the magnetic elements to determine the displacement of the movable part relative to the fixed part in different dimensions.

However, when the movable part moves relative to the fixed part in two or more different dimensions at the same time, it would be difficult to achieve accurate measurement and positioning between the movable part and the fixed part due to the crosstalk effect. Therefore, addressing the aforementioned problems has become a challenge.

BRIEF SUMMARY OF INVENTION

To address the deficiencies of conventional products, an embodiment of the invention provides an optical system that includes a movable part, a fixed part, a driving assembly, a first sensor, a second sensor, and a control unit. The movable part is connected to an optical element and movably connected to the fixed part. The driving assembly drives the movable part to move relative to the fixed part. The first sensor generates a first sensing value by detecting the movement of the movable part relative to the fixed part in a first dimension. The second sensor generates a second sensing value by detecting the movement of the movable part relative to the fixed part in a second dimension.

The control unit is electrically connected to the first and second sensors and generating a first error value according to the first sensing value and a first error curve, wherein the control unit calibrates the second sensing value according to the first error value and then transmits a driving signal to the driving assembly, thereby driving the movable part to move relative to the fixed part. The first error curve represents the relationship between the second sensing value generated by the second sensor and the first dimension when the movable part moves relative to the fixed part only in the first dimension.

In some embodiments, the first error curve is established by an external calibration device measuring the movement of the movable part relative to the fixed part, and the external calibration device is removed from the optical system after the first error curve is established.

In some embodiments, when the external calibration device measures the movement of the movable part relative to the fixed part, the movable part is stationary at an original point of the second dimension.

In some embodiments, the optical system further includes a first magnetic element and a second magnetic element disposed on the movable part, wherein the first magnetic element has a first polar direction, the second magnetic element has a second polar direction, and the first and second sensors respectively detect the magnetic fields of the first and second magnetic elements.

In some embodiments, the first polar direction is not parallel to the second polar direction.

In some embodiments, the first and second polar directions are perpendicular to an optical axis of the optical element.

In some embodiments, the first and second polar directions are angled at 45 degrees relative to each other.

In some embodiments, the optical system further includes a first magnetic element and a second magnetic element. The first magnetic element has a first polar direction, wherein the first sensor detects the magnetic field of the first magnetic element in the first polar direction. The second magnetic element has a second polar direction, wherein the second sensor detects the magnetic field of the second magnetic element in the second polar direction.

In some embodiments, the first and second magnetic elements are disposed on the movable part, and the first and second sensors are disposed on the fixed part.

In some embodiments, the first dimension is a linear dimension that is perpendicular to an optical axis of the optical element, and the second dimension is an angular dimension.

In some embodiments, the optical system further includes a third sensor that generates a third sensing value by detecting the movement of the movable part relative to the fixed part in a third dimension, wherein the third dimension is different from the first and second dimensions.

In some embodiments, the control unit is electrically connected to the third sensor and generates a second error value according to the third sensing value and a second error curve, wherein the control unit calibrates the second sensing value according to the first and second error values and then transmits the driving signal to the driving assembly, thereby driving the movable part to move relative to the fixed part, wherein the second error curve represents the relationship between the second sensing value generated by the second sensor and the third dimension when the movable part moves relative to the fixed part only in the third dimension.

In some embodiments, the second error curve is established by an external calibration device measuring the movement of the movable part relative to the fixed part, and the external calibration device is removed from the optical system after the second error curve is established.

In some embodiments, when the external calibration device measures the movement of the movable part relative to the fixed part, the movable part is stationary at an original point of the second dimension.

In some embodiments, the optical system further includes a first magnetic element, a second magnetic element, and a third magnetic element. The first magnetic element has a first polar direction, wherein the first sensor detects the magnetic field of the first magnetic element in the first polar direction. The second magnetic element has a second polar direction, wherein the second sensor detects the magnetic field of the second magnetic element in the second polar direction, and the second polar direction is different from the first polar direction. The third magnetic element has a third polar direction, wherein the third sensor detects the magnetic field of the third magnetic element in the third polar direction.

In some embodiments, the third polar direction is perpendicular to the first polar direction.

In some embodiments, the third polar direction is angled relative to the first polar direction.

In some embodiments, the third polar direction is parallel to the first polar direction or the second polar direction.

In some embodiments, the first, second, and third magnetic elements are disposed on the movable part, and the first, second, and third sensors are disposed on the fixed part.

In some embodiments, the third dimension is a linear dimension that is perpendicular to an optical axis of the optical element, and the second dimension is an angular dimension.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the optical system are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted by an idealized or overly formal manner unless defined otherwise.

Figure 1:
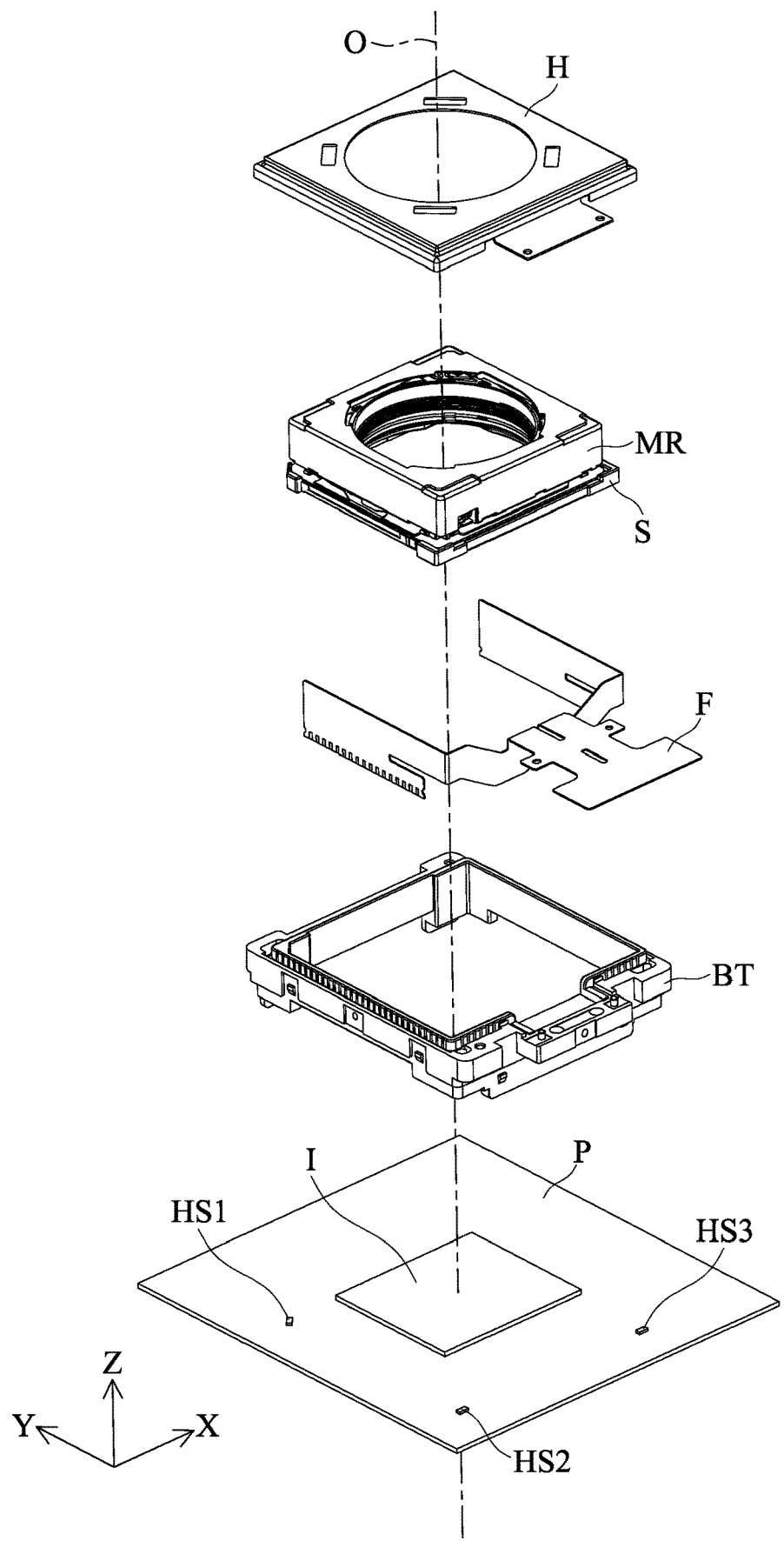
FIGS. 1 and 2 are exploded diagrams of an optical system in accordance with an embodiment of the invention.
Figure 2:
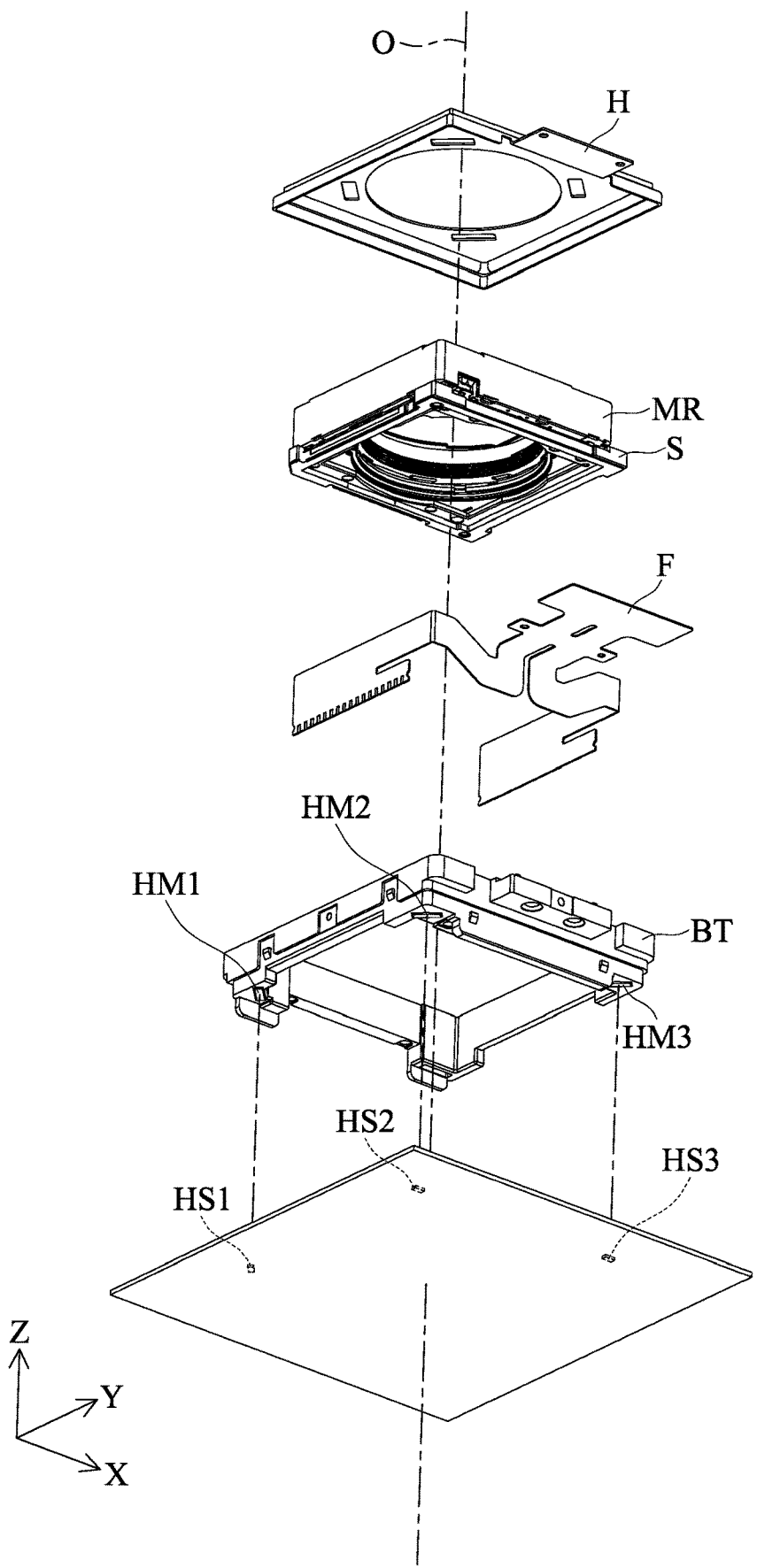
Figure 3:
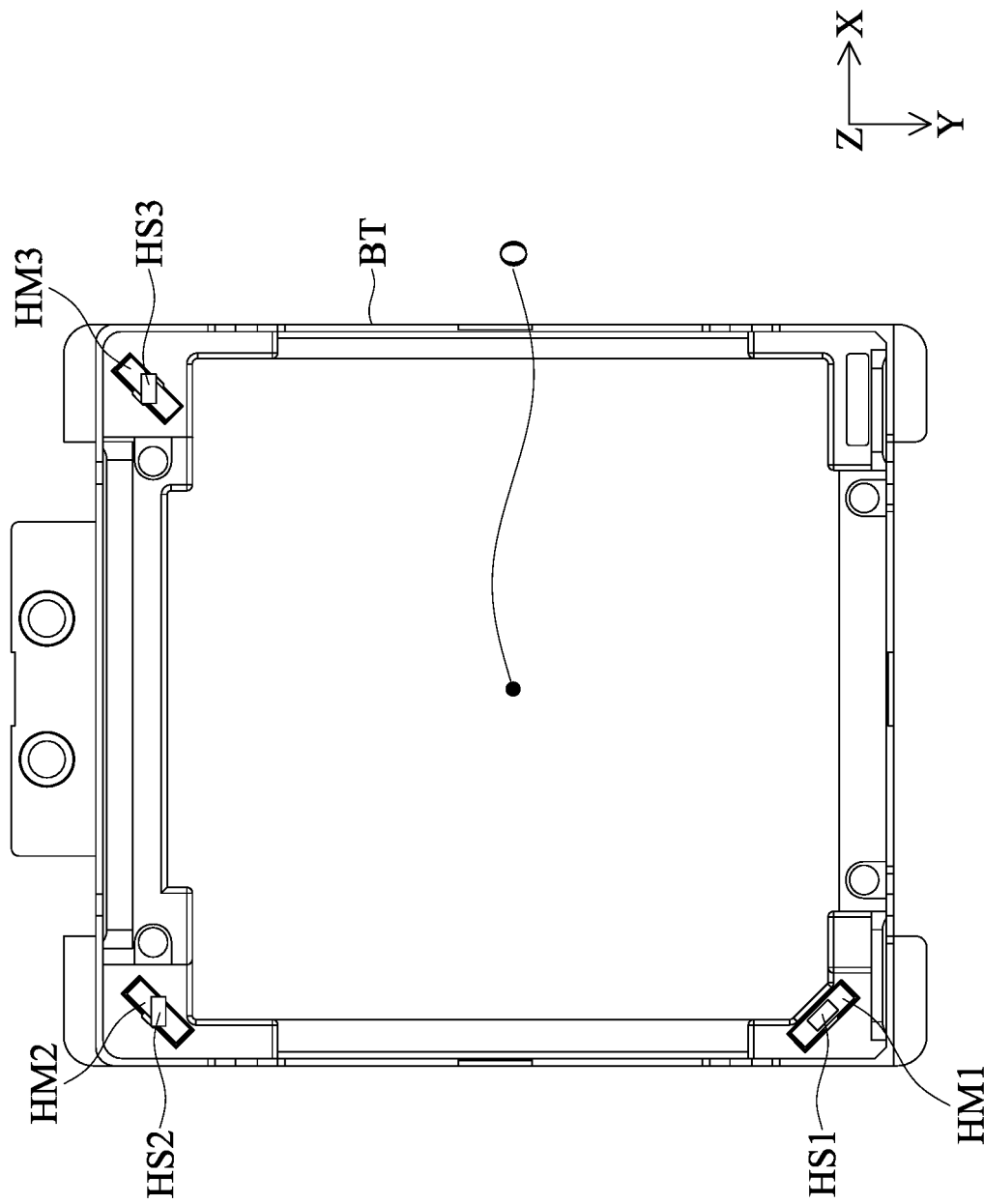
FIG. 3 is a schematic diagram that shows the relative position of the frame BT, the magnetic elements HM1, HM2, and HM3 disposed on the frame BT, and the sensors HS1, HS2, and HS3 disposed on the substrate P.

FIGS. 1 and 2 are exploded diagrams of an optical system in accordance with an embodiment of the invention. FIG. 3 is a schematic diagram that shows the relative position of the frame BT, the magnetic elements HM1, HM2, and HM3 disposed on the frame BT, and the sensors HS1, HS2, and HS3 disposed on the substrate P.

Referring to FIGS. 1 and 2, the optical system in this embodiment may be a camera system that primarily includes a cover H, a holder unit MR, a driving assembly S, a flexible printed circuit F, a frame BT, a substrate P, and an image sensor I. The housing H is affixed to the frame BT, and the holder unit MR and the flexible printed circuit F are received in a space between the housing H and the frame BT. The image sensor I is disposed on the substrate P.

An optical element such as an optical lens may be disposed in the holder unit MR, and the holder unit MR can be electrically connected to an external circuit via the flexible printed circuit F. For example, the holder unit MR may comprise a Voice Coil Motor (VCM) that can drive the optical element (e.g. optical lens) to move along the Z axis.

The driving assembly S is disposed at the bottom of the holder unit MR and connected to the substrate P. In this embodiment, the driving assembly S may comprise several Shape Memory Alloy (SMA) elements. When a current signal is applied to the SMA elements via the substrate P (e.g. PCB), the SMA elements can expand or contract to drive the movable part (including the cover H, a holder unit MR, the flexible printed circuit F, the frame BT, and the optical element) to move relative to the fixed part (including the substrate P and the image sensor I) in a horizontal direction that is perpendicular to the optical axis O of the optical element, or rotate relative to the fixed part around the optical axis O, wherein the optical axis O is parallel to the Z axis.

It should be noted that three magnetic elements HM1, HM2, and HM3 (referred to as first, third, and second magnetic elements) are disposed on the frame BT, and three sensors HS1, HS2, and HS3 (referred to as first, third, and second sensors) are disposed on the substrate P. Here, the sensors HS1, HS2, and HS3 are located below the magnetic elements HM1, HM2, and HM3, and they can detect the magnetic fields of the magnetic elements HM1, HM2, and HM3 to determine the displacement of the movable part relative to the fixed part in different dimensions.

As shown in FIG. 3, each of the three magnetic elements HM1, HM2, and HM3 has a longitudinal structure, and each of the three sensors HS1, HS2, and HS3 also has a longitudinal structure. It should be noted that the magnetic element HM1 and the sensor HS1 are arranged along the Z axis and adjacent to each other. The magnetic element HM2 and the sensor HS2 are arranged along the Z axis and adjacent to each other. Similarly, the magnetic element HM3 and the sensor HS3 are arranged along the Z axis and adjacent to each other. When viewed in the vertical direction (i.e. along the Z axis), the longitudinal axes of the magnetic element HM1 and the sensor HS1 extend in the same direction, the longitudinal axes of the magnetic element HM2 and the sensor HS2 extend in different directions, and the longitudinal axes of the magnetic element HM3 and the sensor HS3 extend in different directions. For example, the sensors HS1, HS2, and HS3 may comprise Hall sensors, magnetoresistance effect sensors (MR sensors), giant magnetoresistance effect sensors (GMR sensors), or tunneling magnetoresistance effect sensors (TMR sensors), and the magnetic elements HM1, HM2, and HM3 may comprise magnets.

Figure 4:
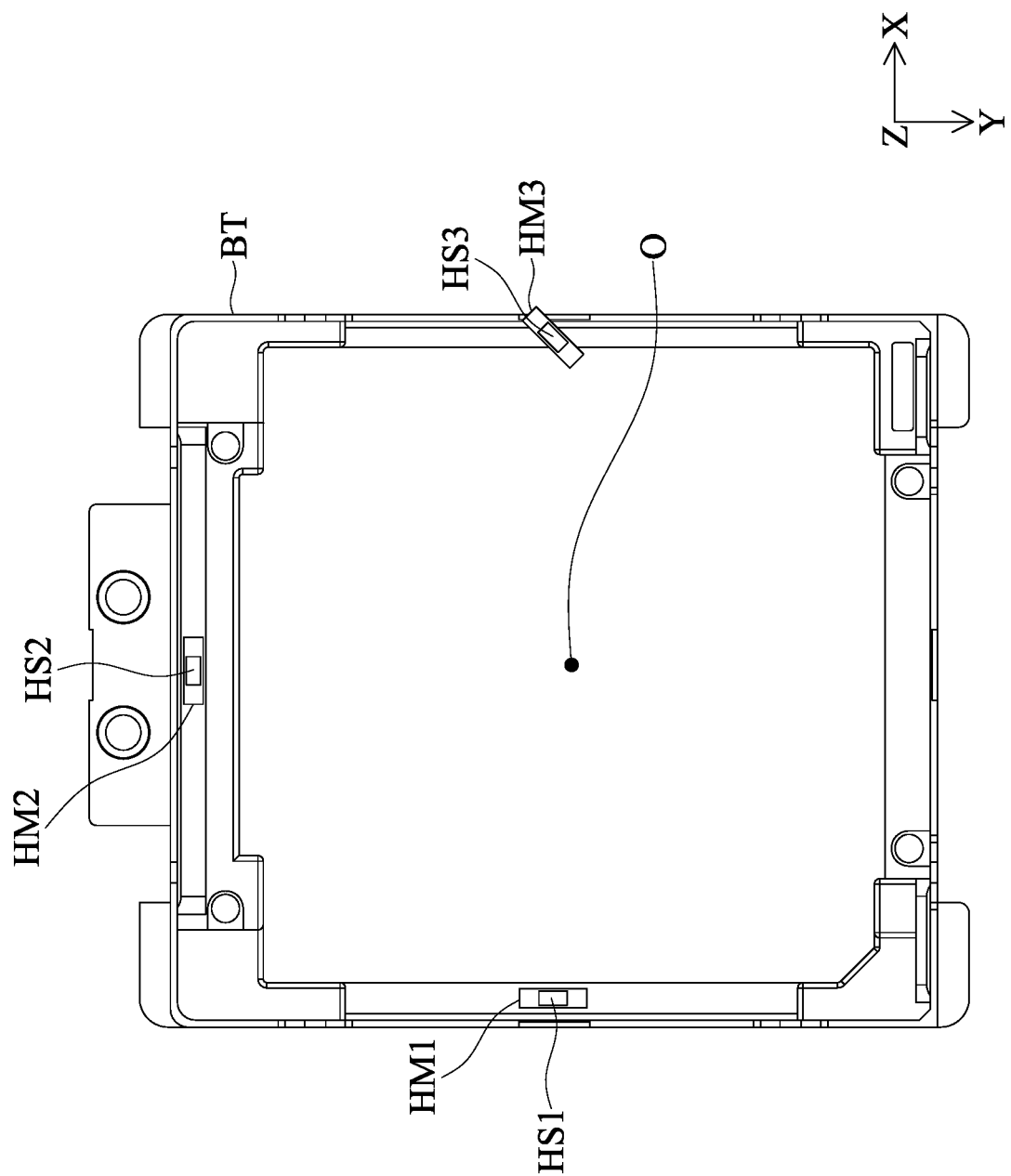
FIG. 4 is a schematic diagram that shows the relative position of the frame BT, the magnetic elements HM1, HM2, and HM3 disposed on the frame BT, and the sensors HS1, HS2, and HS3 disposed on the substrate P, in accordance with another embodiment of the invention.

FIG. 4 is a schematic diagram that shows the relative position of the frame BT, the magnetic elements HM1, HM2, and HM3 disposed on the frame BT, and the sensors HS1, HS2, and HS3 disposed on the substrate P, in accordance with another embodiment of the invention.

Referring to FIG. 4, in another embodiment of the optical system, the magnetic elements HM1 and HM2 are respectively disposed at a central position of two adjacent sides of the frame BT. Moreover, the magnetic element HM3 is disposed at a central position of another side of the frame BT, opposite to the side where the magnetic element HM1 is disposed.

Here, the magnetic element HM1 has a polar direction that is parallel to the X axis, the magnetic element HM2 has a polar direction that is parallel to the Y axis, and the magnetic element HM3 has a polar direction that is neither parallel to nor perpendicular to the X and Y axes. In FIG. 4, the polar direction of the magnetic element HM3 is angled relative to the X and Y axes at 45 degrees relative to each other, however, the invention is not limited thereto.

As mentioned above, the sensors HS1, HS2, and HS3 are configured to detect the magnetic fields of the magnetic elements HM1, HM2, and HM3, whereby the displacement of the movable part relative to the fixed part in different dimensions can be determined.

In this embodiment, as the magnetic elements HM1, HM2, and HM3 have different polar directions, the sensor HS1 can be used to detect the displacement of the movable part relative to the fixed part along the X axis, the sensor HS2 can be used to detect the displacement of the movable part relative to the fixed part along the Y axis, and the sensor HS3 can be used to detect the rotation of the movable part relative to the fixed part around the optical axis O.

Figure 5:
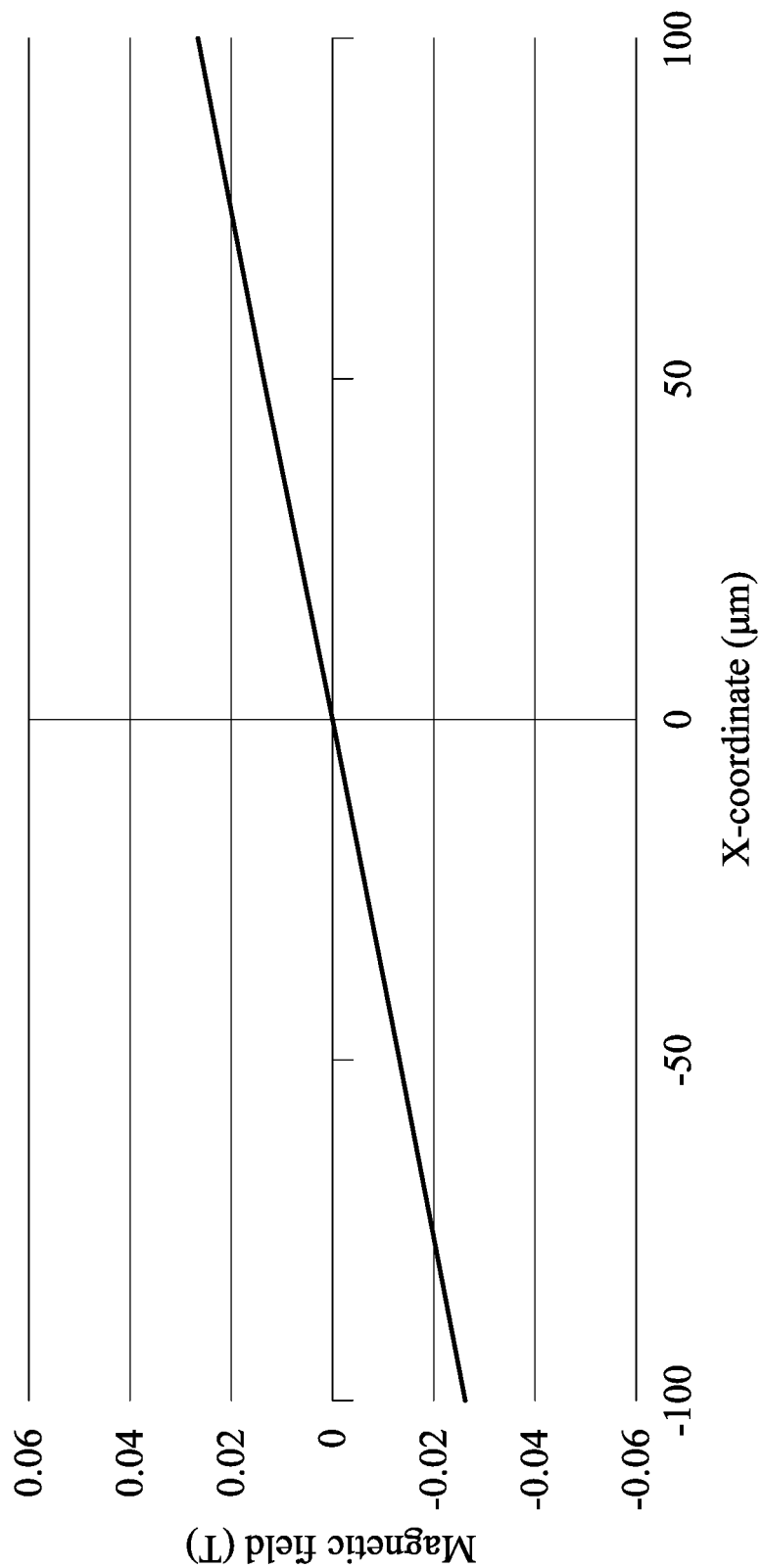
FIGS. 5-7 are schematic diagrams showing the relationship between the magnetic field variations detected by the sensors HS1, HS2, and HS3 and the X-coordinate when the movable part moves only along the X axis within a small range relative to the fixed part.
Figure 6:
Figure 7:
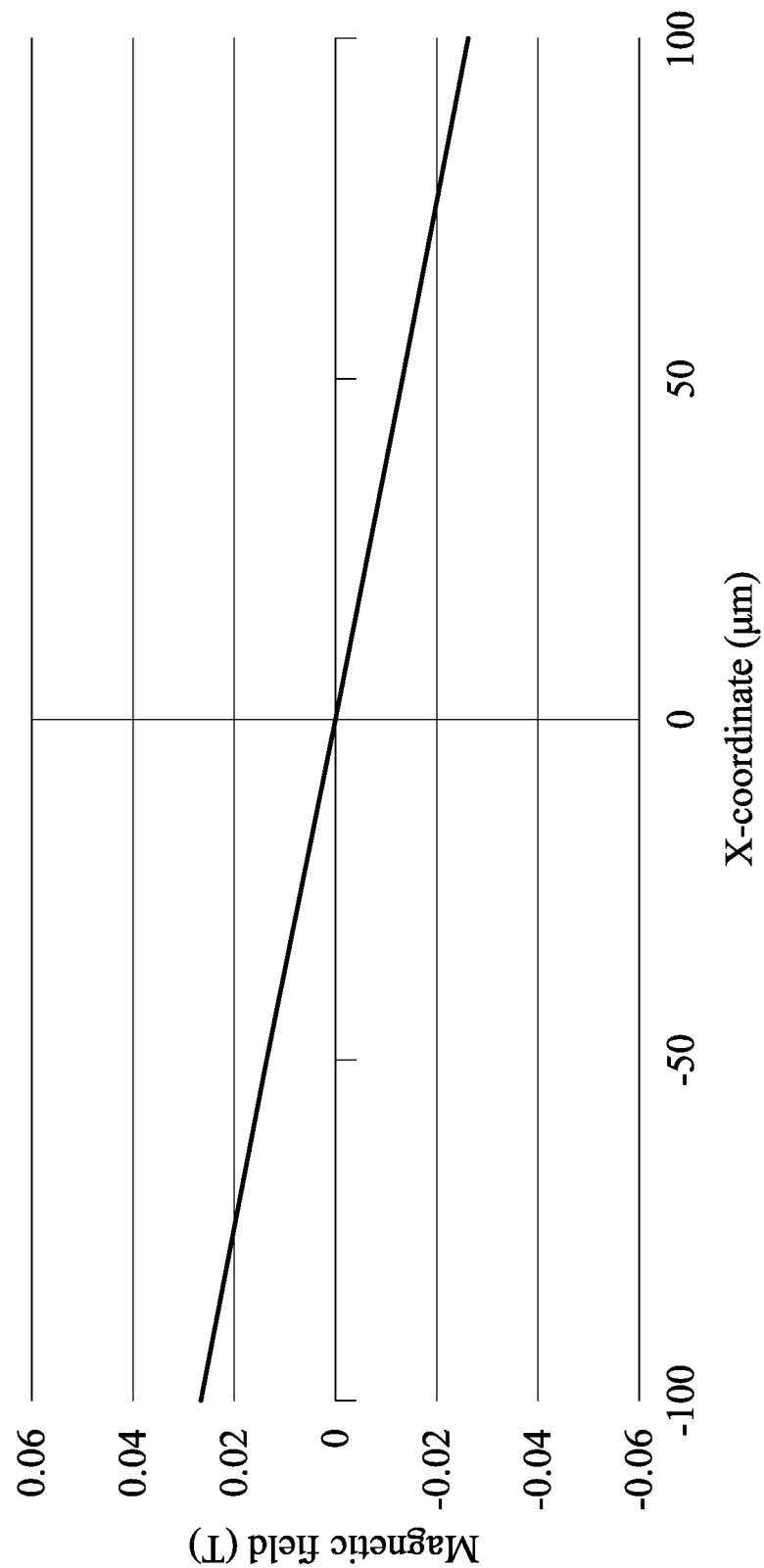

FIGS. 5-7 are schematic diagrams showing the relationship between the magnetic field variations detected by the sensors HS1, HS2, and HS3 and the X-coordinate when the movable part moves only along the X axis within a small range relative to the fixed part.

As shown in FIG. 5, since the polar direction of the magnetic element HM1 is parallel to the X axis, the sensor HS1 can detect the magnetic field variation of the magnetic element HM1 when the movable part moves only along the X axis relative to the fixed part.

However, as shown in FIG. 6, since the polar direction of the magnetic element HM2 is perpendicular to the X axis, the sensor HS2 would not detect the magnetic field variation of the magnetic element HM2 when the movable part moves only along the X axis relative to the fixed part.

Moreover, as shown in FIG. 7, though the movable part moves only along the X axis and does not rotate relative to the fixed part, the sensor HS3 can still detect the magnetic field variation of the magnetic element HM3 due to the crosstalk effect. It should be realized that the magnetic field variation (FIG. 7) detected by the sensor HS3 does not reflect the actual angular replacement of the movable part relative to the fixed part. In fact, the curve presented in FIG. 7 is an error curve (first error curve) that is caused by the crosstalk effect.

Figure 8:
FIGS. 8-10 are schematic diagrams showing the relationship between the magnetic field variations detected by the sensors HS1, HS2, and HS3 and the Y-coordinate when the movable part moves only along the Y axis within a small range relative to the fixed part.
Figure 9:
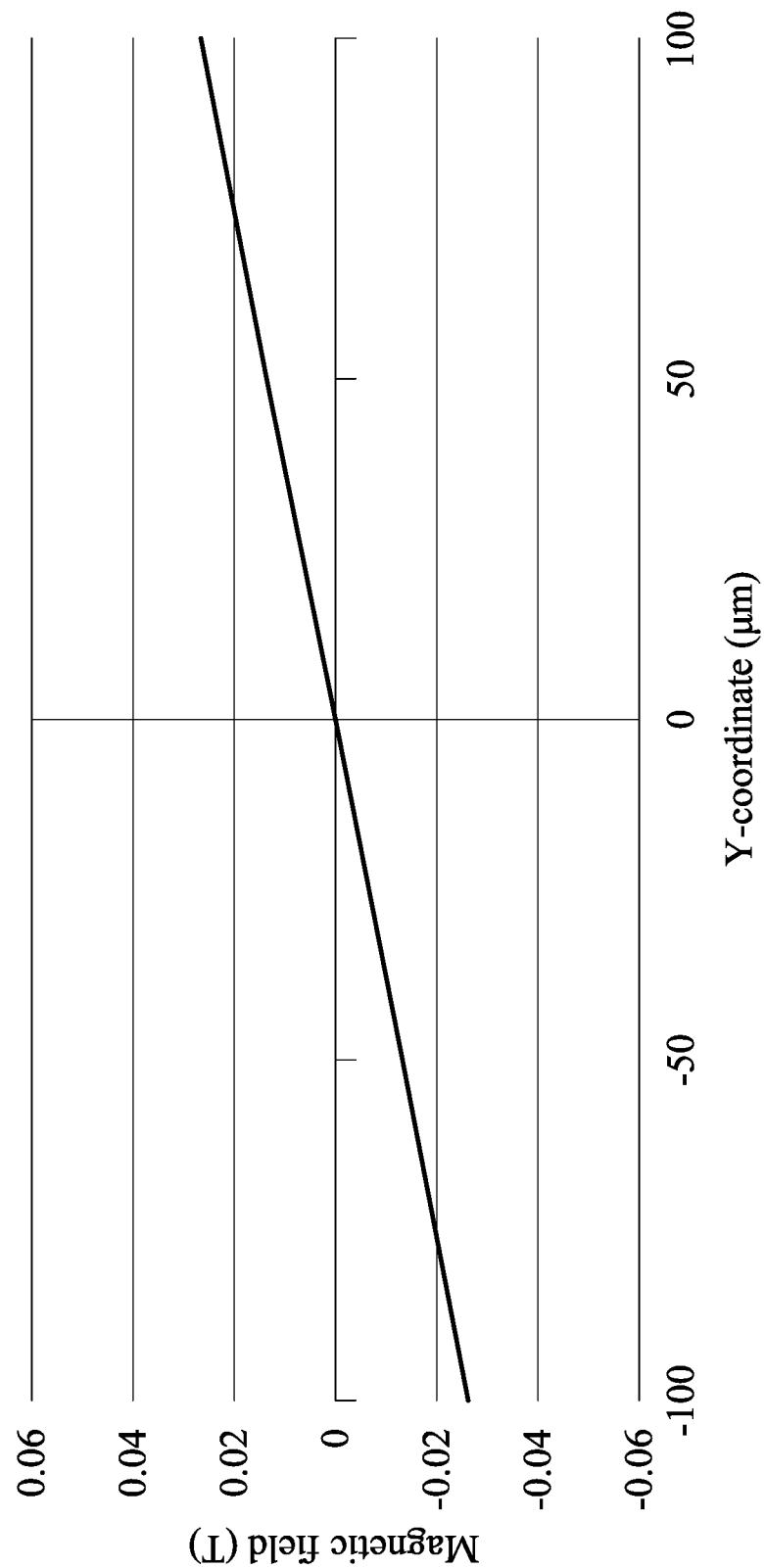
Figure 10:
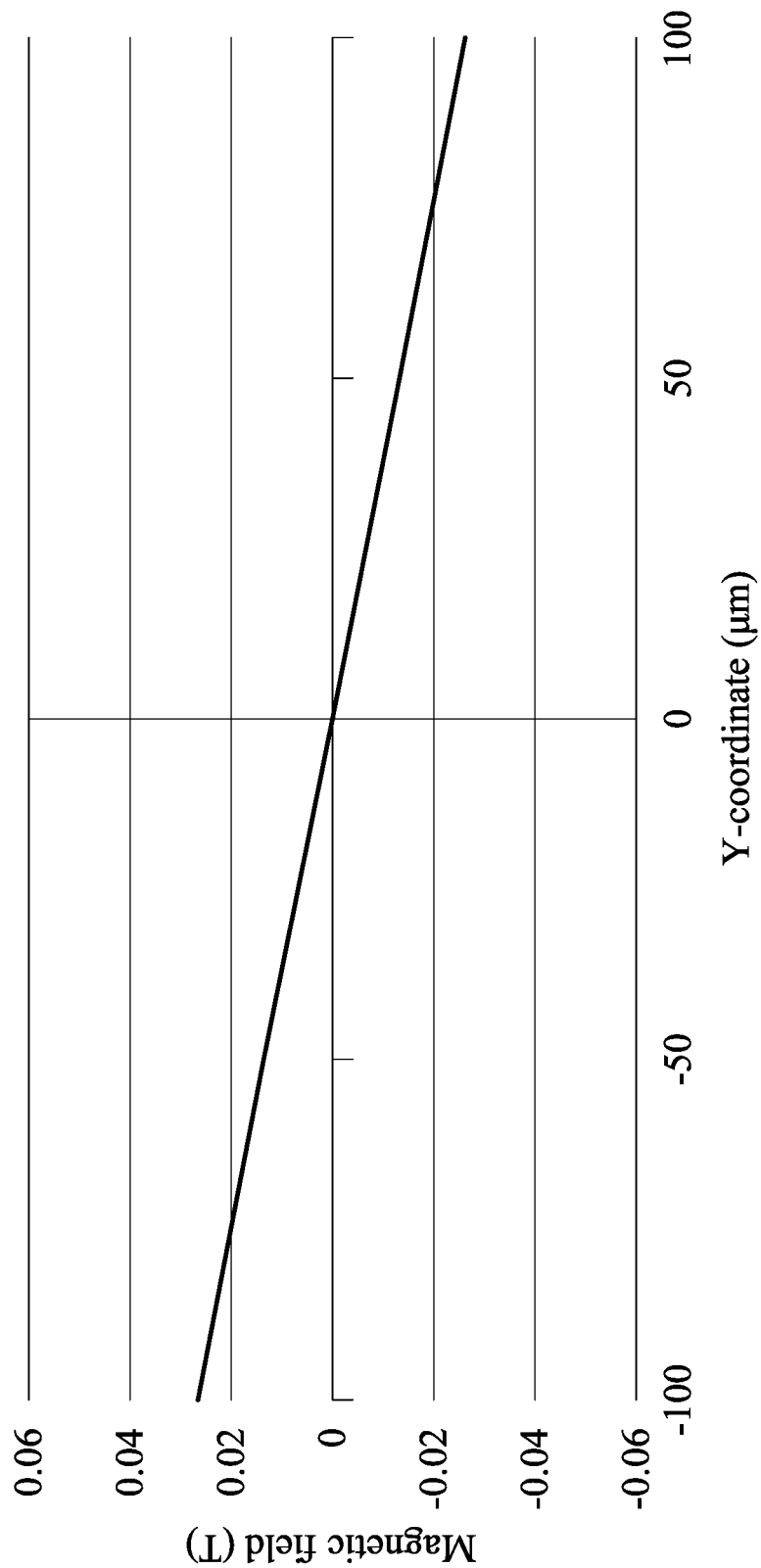

FIGS. 8-10 are schematic diagrams showing the relationship between the magnetic field variations detected by the sensors HS1, HS2, and HS3 and the Y-coordinate when the movable part moves only along the Y axis within a small range relative to the fixed part.

As shown in FIG. 8, since the polar direction of the magnetic element HM1 is perpendicular to the Y axis, the sensor HS1 would not detect the magnetic field variation of the magnetic element HM1 when the movable part moves only along the Y axis relative to the fixed part.

However, as shown in FIG. 9, since the polar direction of the magnetic element HM2 is parallel to the Y axis, the sensor HS2 can detect the magnetic field variation of the magnetic element HM2 when the movable part moves only along the Y axis relative to the fixed part.

Moreover, as shown in FIG. 10, though the movable part moves only along the Y axis and does not rotate relative to the fixed part, the sensor HS3 can still detect the magnetic field variation of the magnetic element HM3 due to the crosstalk effect. It should be realized that the magnetic field variation (FIG. 10) detected by the sensor HS3 does not reflect the actual angular replacement of the movable part relative to the fixed part. In fact, the curve presented in FIG. 10 is another error curve (second error curve) that is also caused by the crosstalk effect.

Figure 11:
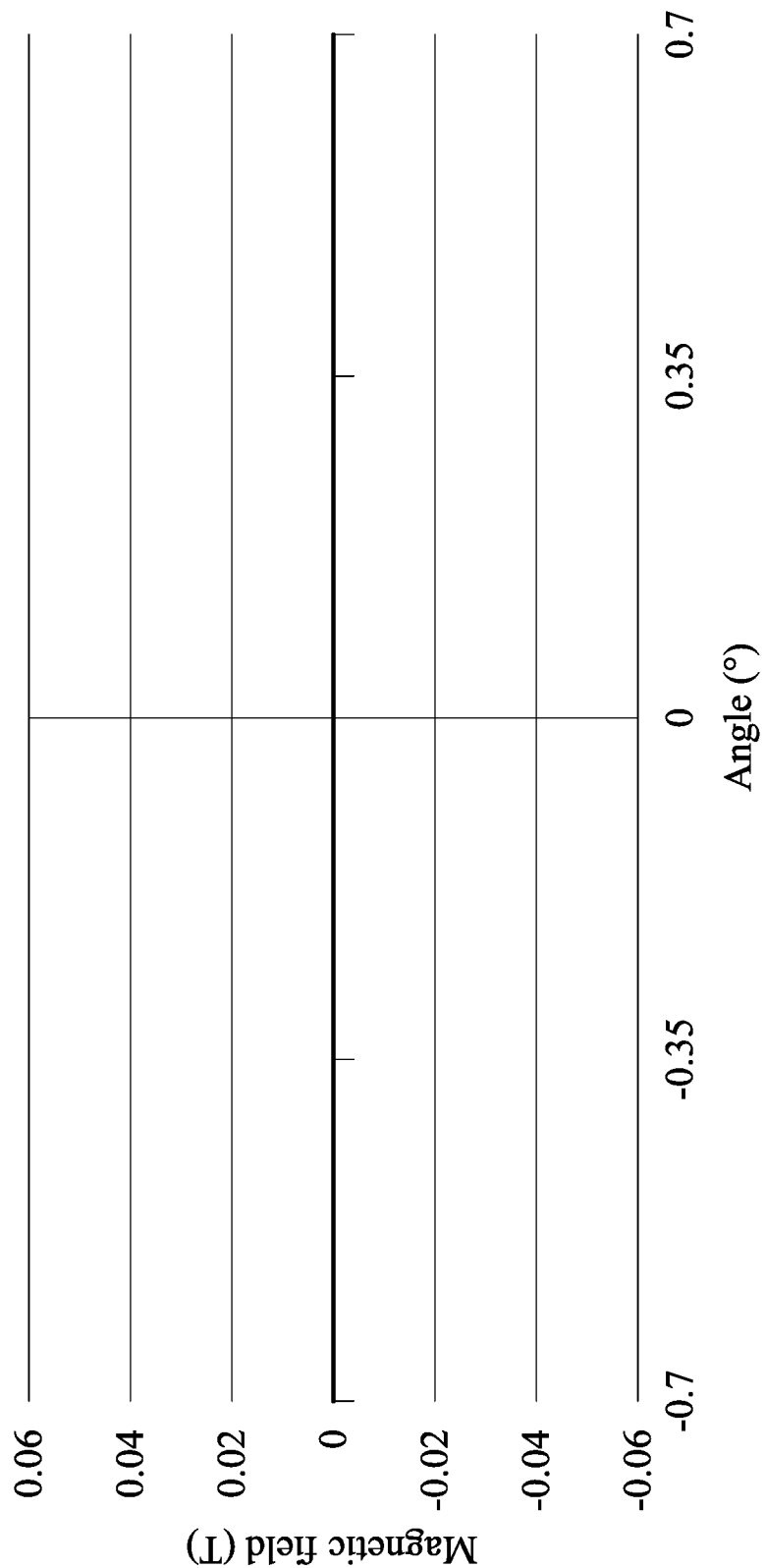
FIGS. 11-13 are schematic diagrams showing the relationship between the magnetic field variations detected by the sensors HS1, HS2, and HS3 and an angular coordinate when the movable part only rotates along the angular coordinate within a small range relative to the fixed part.
Figure 12:
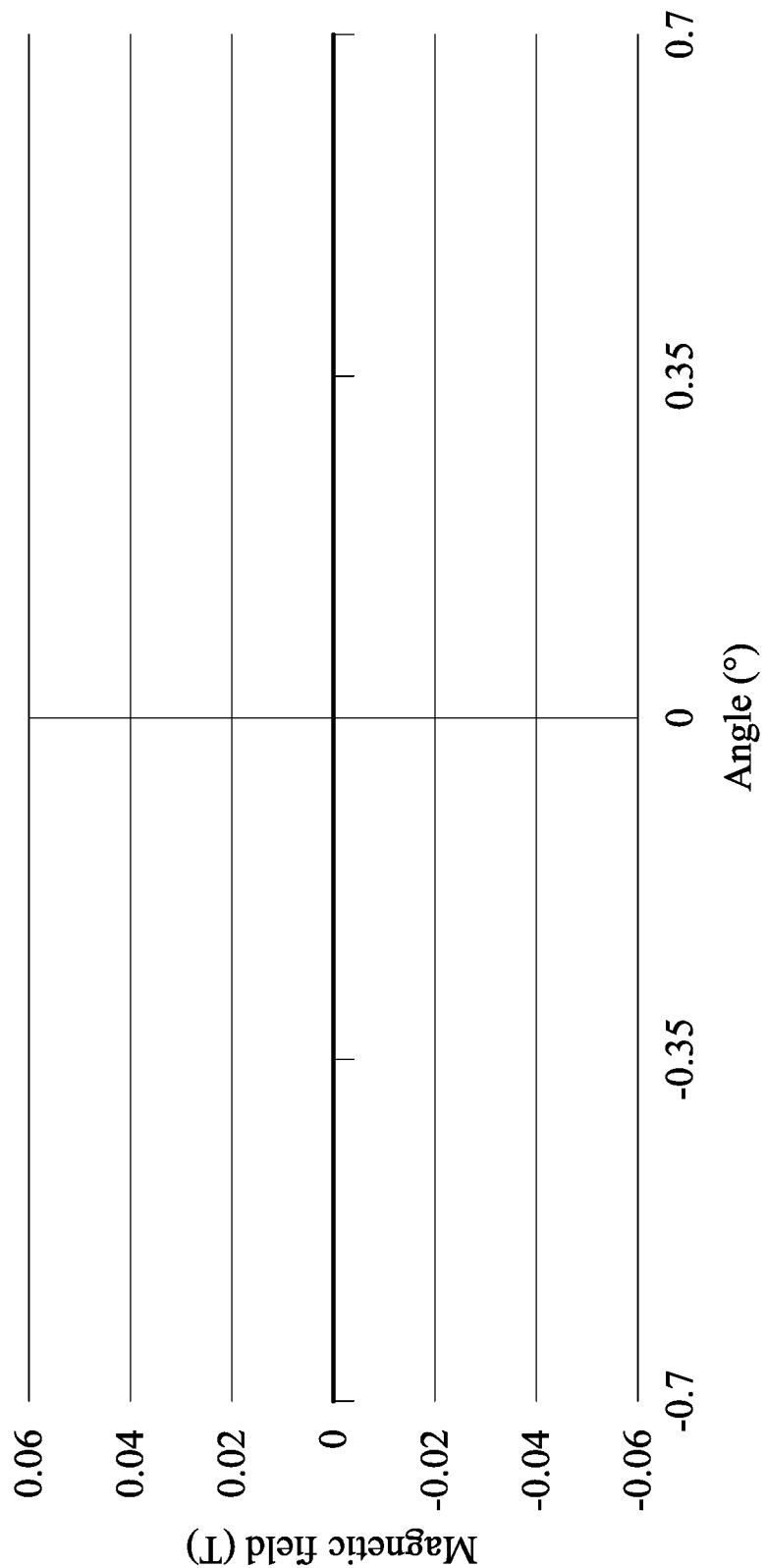
Figure 13:
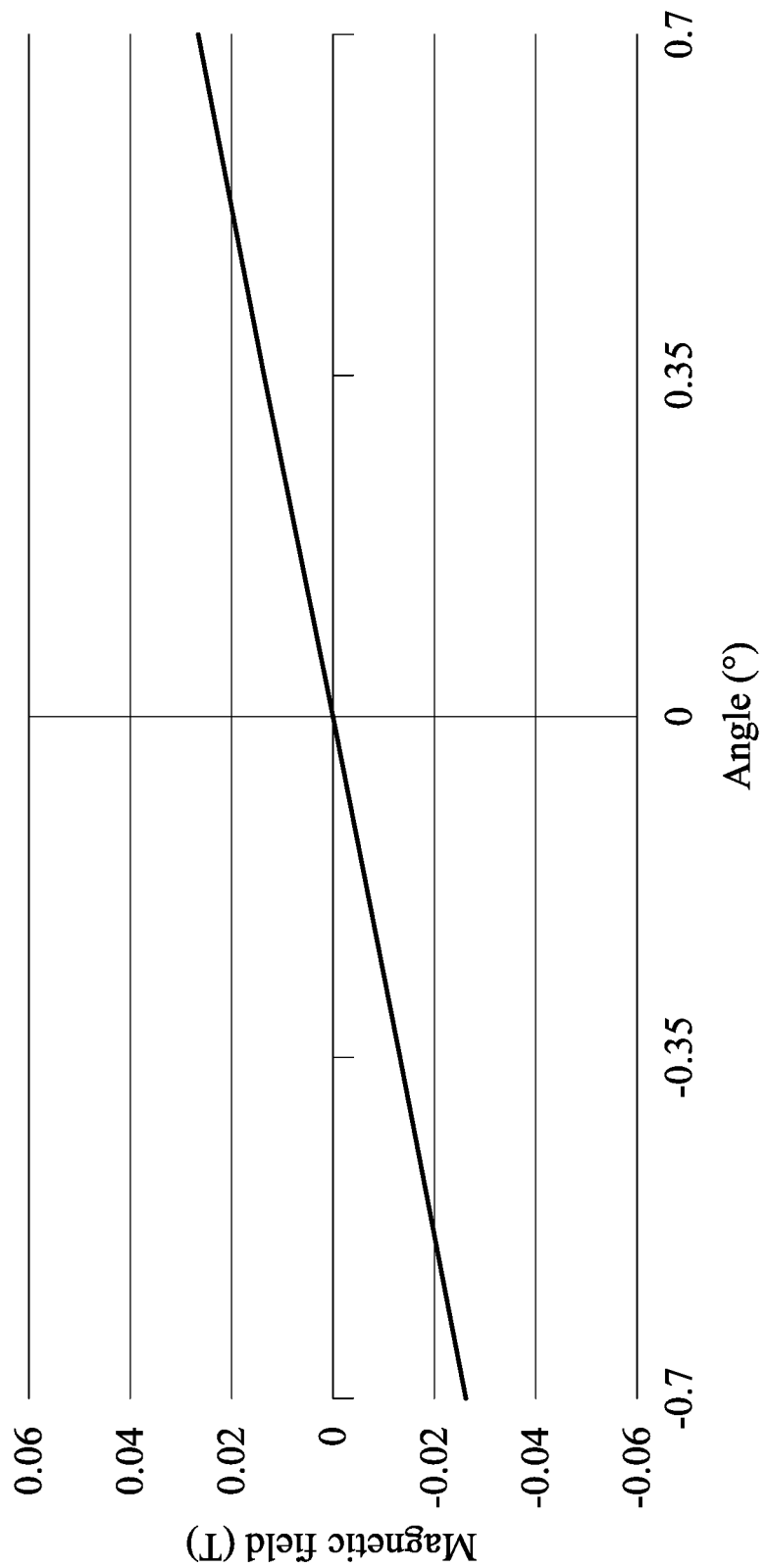

FIGS. 11-13 are schematic diagrams showing the relationship between the magnetic field variations detected by the sensors HS1, HS2, and HS3 and an angular coordinate when the movable part only rotates along the angular coordinate within a small range relative to the fixed part.

As shown in FIGS. 11-13, when the movable part only rotates around the optical axis O within a small range relative to the fixed par, the sensors HS1 and HS2 would not detect the magnetic field variation of the magnetic elements HM1 and HM2 (FIGS. 11 and 12), and only the sensor HS3 can detect the magnetic field variation of the magnetic element HM3.

It should be noted that the sensors HS1, HS2, and HS3 respectively generate a sensing value when detecting the magnetic elements HM1, HM2 and HM3. Hence, the first error curve of FIG. 7 can represent the relationship between the sensing value generated by the sensor HS3 and the X-coordinate when the movable part moves relative to the fixed part only along the X axis.

Similarly, the second error curve of FIG. 10 can represent the relationship between the sensing value generated by the sensor HS3 and the Y-coordinate when the movable part moves relative to the fixed part only along the Y axis.

To achieve accurate angular position measurement between the movable part and the fixed part of the optical system, the sensing value of the sensor HS3 should be calibrated, so that the crosstalk influence due to the movement of the movable part along the X and Y axes can be reduced. In some embodiments, a control unit (not shown) may be provided in the optical system to calibrate the sensing value of the sensor HS3, wherein the control unit may be a processor disposed on the substrate P and electrically connected to the sensors HS1, HS2, and HS3.

Specifically, the control unit can receive the sensing values generated from the sensors HS1, HS2, and HS3, and then calibrate the sensing value of the sensor HS3 to obtain the actual angular displacement of the movable part relative to the fixed part.

After the actual angular displacement information is acquired, all the displacements of the movable part relative to the fixed part along the X and Y axes and around the optical axis O can be determined. Subsequently, the control unit can transmit a driving signal to the driving assembly S, thereby driving the movable part to move to a target position relative to the fixed part and achieving precise position control of the optical system.

In practice, when the movable part moves along the X axis (first dimension) and rotates along an angular coordinate (second dimension) around the optical axis O at the same time, the actual displacement of the movable part along the X axis can be determined by referring to the relationship curve between the sensing signal (first sensing signal) generated by the sensor HS1 (first sensor) and the X-coordinate (FIG. 5).

Next, the control unit can generate a first error value according to the actual displacement of the movable part along the X axis and the first error curve (FIG. 7), and then calibrate the sensing value (second sensing value) generated by the sensor HS3 (second sensor) by the first error value. Therefore, the crosstalk effect due to the movement of the movable part along the X and Y axes can be reduced, and the actual angular displacement of the movable part relative to the fixed part can be obtained.

In some cases, if the movable part further moves along the Y axis (third dimension) at the same time, the actual displacement of the movable part along the Y axis can be determined by referring to the relationship curve between the sensing signal (third sensing signal) generated by the sensor HS2 (third sensor) and the Y-coordinate (FIG. 8).

In this circumstance, the control unit can generate a second error value according to the actual displacement of the movable part along the Y axis and the second error curve (FIG. 10), and then calibrate the sensing value (second sensing value) generated by the sensor HS3 (second sensor) by the first and second error values. Therefore, the crosstalk effect due to the movement of the movable part along the X and Y axes can be reduced, and the actual angular displacement of the movable part relative to the fixed part can be obtained.

Finally, the control unit can transmit a driving signal to the driving assembly S, thus driving the movable part to move to a target position relative to the fixed part and achieving precise position control of the optical system.

In this embodiment, the first and second error curves (FIGS. 7 and 10) are established by an external calibration device (not shown) measuring the movement of the movable part relative to the fixed part. The external calibration device can be removed from the optical system after the first and second error curves are generated.

It should be noted that when the external calibration device measures the movement of the movable part relative to the fixed part, the movable part is stationary at the original point of the angular coordinate (second dimension). As mentioned above, the first and third dimensions are linear dimensions (the X and Y axes) perpendicular to the optical axis O of the optical element, and the second dimension is an angular dimension that has an origin axis parallel to the optical axis O and perpendicular to the first and second dimension (the X and Y axes).

Figure 14:
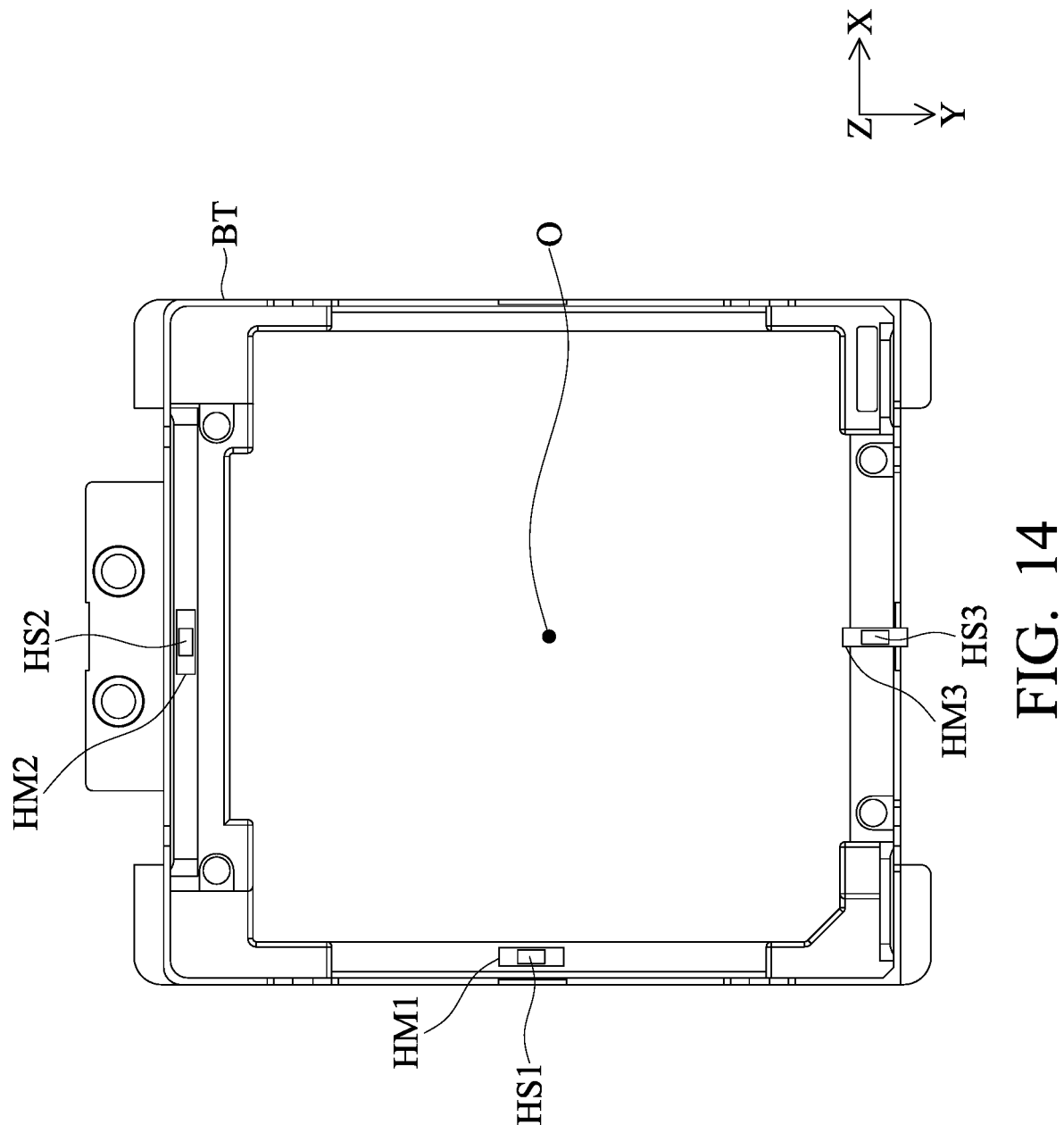
FIG. 14 is a schematic diagram that shows the relative position of the frame BT, the magnetic elements HM1, HM2, and HM3 disposed on the frame BT, and the sensors HS1, HS2, and HS3 disposed on the substrate P, in accordance with another embodiment of the invention.

FIG. 14 is a schematic diagram that shows the relative position of the frame BT, the magnetic elements HM1, HM2, and HM3 disposed on the frame BT, and the sensors HS1, HS2, and HS3 disposed on the substrate P, in accordance with another embodiment of the invention.

Referring to FIG. 14, this embodiment is different from FIG. 4 in that the magnetic element HM1 (first magnetic element) has a polar direction (first polar direction) that is parallel to the X axis, the magnetic element HM3 (second magnetic element) has a polar direction (second polar direction) that is also parallel to the X axis, and the magnetic element HM2 (third magnetic element) has a polar direction (third polar direction) that is parallel to the Y axis, wherein all the polar directions of the magnetic elements HM1, HM2, and HM3 are perpendicular to the optical axis O.

In some embodiments, the polar direction (third polar direction) of the magnetic element HM2 (third magnetic element) may also be angled relative to the polar direction (first polar direction) of the magnetic element HM1 (first magnetic element). In some embodiments, the polar direction (third polar direction) of the magnetic element HM2 (third magnetic element) may be parallel to the polar direction (first polar direction) of the magnetic element HM1 (first magnetic element) or the polar direction (second polar direction) of the magnetic element HM3 (second magnetic element).

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An optical system, comprising:
   a movable part, connected to an optical element;
   a fixed part, wherein the movable part is movably connected to the fixed part;
   a driving assembly, driving the movable part to move relative to the fixed part;
   a longitudinal second sensor, detecting the movement of the movable part relative to the fixed part; and a longitudinal second magnetic element, located adjacent to the second sensor, wherein the second sensor and the second magnetic element are arranged in a vertical direction, and when viewed in the vertical direction, the longitudinal axes of the second magnetic element and the second sensor extend in different directions that form an acute angle therebetween.

2. The optical system as claimed in claim 1, further comprising:
a first sensor, generating a first sensing value by detecting the movement of the movable part relative to the fixed part in a first dimension; and
a control unit, electrically connected to the first and second sensors;
wherein the second sensor generates a second sensing value by detecting the movement of the movable part relative to the fixed part in a second dimension, and the control unit generates a first error value according to the first sensing value and a first error curve;
wherein the control unit calibrates the second sensing value according to the first error value and then transmits a driving signal to the driving assembly, thereby driving the movable part to move relative to the fixed part;
wherein the first error curve represents the relationship between the second sensing value generated by the second sensor and the first dimension when the movable part moves relative to the fixed part only in the first dimension;
wherein the first error curve is established by an external calibration device measuring the movement of the movable part relative to the fixed part, and the external calibration device is removed from the optical system after the first error curve is established.

3. The optical system as claimed in claim 2, wherein when the external calibration device measures the movement of the movable part relative to the fixed part, the movable part is stationary at an original point of the second dimension.

4. The optical system as claimed in claim 2, further comprising a first magnetic element, wherein the first magnetic element has a first polar direction, the second magnetic element has a second polar direction, and the first and second sensors respectively detect the magnetic fields of the first and second magnetic elements.

5. The optical system as claimed in claim 4, wherein the first polar direction is not parallel to the second polar direction.

6. The optical system as claimed in claim 4, wherein the first and second polar directions are perpendicular to an optical axis of the optical element.

7. The optical system as claimed in claim 4, wherein the first and second polar directions are angled at 45 degrees relative to each other.

8. The optical system as claimed in claim 2, further comprising a first magnetic element that has a first polar direction, wherein the first sensor detects the magnetic field of the first magnetic element in the first polar direction, and the second magnetic element has a second polar direction, wherein the second sensor detects the magnetic field of the second magnetic element in the second polar direction.

9. The optical system as claimed in claim 8, wherein the first and second magnetic elements are disposed on the movable part, and the first and second sensors are disposed on the fixed part.

10. The optical system as claimed in claim 2, wherein the first dimension is a linear dimension that is perpendicular to an optical axis of the optical element, and the second dimension is an angular dimension.

11. The optical system as claimed in claim 2, further comprising a third sensor that generates a third sensing value by detecting the movement of the movable part relative to the fixed part in a third dimension, wherein the third dimension is different from the first and second dimensions.

12. The optical system as claimed in claim 11, wherein the control unit is electrically connected to the third sensor and generates a second error value according to the third sensing value and a second error curve, wherein the control unit calibrates the second sensing value according to the first and second error values and then transmits the driving signal to the driving assembly, thereby driving the movable part to move relative to the fixed part, wherein the second error curve represents the relationship between the second sensing value generated by the second sensor and the third dimension when the movable part moves relative to the fixed part only in the third dimension.

13. The optical system as claimed in claim 12, wherein the second error curve is established by an external calibration device measuring the movement of the movable part relative to the fixed part, and the external calibration device is removed from the optical system after the second error curve is established.

14. The optical system as claimed in claim 13, wherein when the external calibration device measures the movement of the movable part relative to the fixed part, the movable part is stationary at an original point of the second dimension.

15. The optical system as claimed in claim 11, further comprising:
a first magnetic element having a first polar direction, wherein the first sensor detects the magnetic field of the first magnetic element in the first polar direction, the second magnetic element has a second polar direction, and the second sensor detects the magnetic field of the second magnetic element in the second polar direction, wherein the second polar direction is different from the first polar direction; and
a third magnetic element having a third polar direction, wherein the third sensor detects the magnetic field of the third magnetic element in the third polar direction.

16. The optical system as claimed in claim 15, wherein the third polar direction is perpendicular to the first polar direction.

17. The optical system as claimed in claim 15, wherein the third polar direction is angled relative to the first polar direction.

18. The optical system as claimed in claim 15, wherein the third polar direction is parallel to the first polar direction or the second polar direction.

19. The optical system as claimed in claim 15, wherein the first, second, and third magnetic elements are disposed on the movable part, and the first, second, and third sensors are disposed on the fixed part.

20. The optical system as claimed in claim 15, wherein the third dimension is a linear dimension that is perpendicular to an optical axis of the optical element, and the second dimension is an angular dimension.

* * * * *